(12) United States Patent
Rossman

(10) Patent No.: US 7,132,134 B2
(45) Date of Patent: *Nov. 7, 2006

(54) STAGGERED IN-SITU DEPOSITION AND ETCHING OF A DIELECTRIC LAYER FOR HDP CVD

(75) Inventor: Kent Rossman, Orlando, FL (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/938,174

(22) Filed: Sep. 10, 2004

(65) Prior Publication Data

US 2005/0032382 A1    Feb. 10, 2005

Related U.S. Application Data

(60) Continuation of application No. 10/234,988, filed on Sep. 4, 2002, now Pat. No. 6,821,577, which is a continuation of application No. 09/733,122, filed on Dec. 8, 2000, now Pat. No. 6,527,910, which is a division of application No. 09/045,278, filed on Mar. 20, 1998, now Pat. No. 6,194,038.

(51) Int. Cl.
*H05H 1/24*    (2006.01)

(52) U.S. Cl. .................. 427/579; 427/97.7; 438/695; 438/696

(58) Field of Classification Search ............. 427/576, 427/579, 97.7; 438/695, 696
See application file for complete search history.

(56) References Cited

U.S. PATENT DOCUMENTS

| 4,565,157 A | 1/1986 | Brors et al. |
| 4,690,746 A | 9/1987 | McInerney et al. |
| 4,732,761 A | 3/1988 | Machida et al. |
| 4,738,748 A | 4/1988 | Kisa |
| 4,747,367 A | 5/1988 | Posa |
| 4,830,705 A | 5/1989 | Loewenstein et al. |
| 4,872,947 A | 10/1989 | Wang et al. |
| 4,892,753 A | 1/1990 | Wang et al. |
| 4,960,488 A | 10/1990 | Law et al. |
| 5,000,113 A | 3/1991 | Wang et al. |

(Continued)

FOREIGN PATENT DOCUMENTS

EP    0478174 A2    4/1992

(Continued)

OTHER PUBLICATIONS

Pending U.S. Appl. No. 09/400,338, filed Sep. 21, 1999, Li-Qun Xia et al.

(Continued)

*Primary Examiner*—Bret Chen
(74) *Attorney, Agent, or Firm*—Townsend and Townsend and Crew LLP

(57) ABSTRACT

A method and apparatus for depositing a conformal dielectric layer employing a dep-etch technique features selectively reducing the flow of deposition gases into a process chamber where a substrate having a stepped surface to be covered by the conformal dielectric layer is disposed. By selectively reducing the flow of deposition gases into the process chamber, the concentration of a sputtering gas, from which a plasma is formed, in the process chamber is increased without increasing the pressure therein. It is preferred that the flow of deposition gases be periodically terminated so as to provide a sputtering gas concentration approaching 100%. In this fashion, the etch rate of a conformal dielectric layer having adequate gap-filling characteristics may be greatly increased, while allowing an increase in the deposition rate of the same.

12 Claims, 9 Drawing Sheets

U.S. PATENT DOCUMENTS

| | | | |
|---|---|---|---|
| 5,089,442 A | 2/1992 | Olmer | |
| 5,093,149 A | 3/1992 | Doehler et al. | |
| 5,133,986 A | 7/1992 | Blum et al. | |
| 5,156,881 A | 10/1992 | Okano et al. | |
| 5,160,408 A | 11/1992 | Long | |
| 5,246,744 A | 9/1993 | Matsuda et al. | |
| 5,270,264 A | 12/1993 | Andideh et al. | |
| 5,271,972 A | 12/1993 | Kwok et al. | |
| 5,275,977 A | 1/1994 | Otsubo et al. | |
| 5,279,865 A | 1/1994 | Cheibi et al. | |
| 5,302,233 A | 4/1994 | Kim et al. | |
| 5,302,555 A | 4/1994 | Yu | |
| 5,319,247 A | 6/1994 | Matsuura | |
| 5,348,774 A | 9/1994 | Golecki et al. | |
| 5,362,526 A | 11/1994 | Wang et al. | |
| 5,416,048 A | 5/1995 | Blalock et al. | |
| 5,468,342 A | 11/1995 | Nulty et al. | |
| 5,522,957 A | 6/1996 | Weling et al. | |
| 5,562,952 A | 10/1996 | Nakahigashi et al. | |
| 5,571,576 A | 11/1996 | Qian et al. | |
| 5,578,532 A | 11/1996 | van de Ven et al. | |
| 5,593,741 A | 1/1997 | Ikeda | |
| 5,599,740 A | 2/1997 | Jang et al. | |
| 5,607,725 A | 3/1997 | Goodman | |
| 5,624,582 A | 4/1997 | Cain | |
| 5,679,606 A | 10/1997 | Wang et al. | |
| 5,719,085 A | 2/1998 | Moon et al. | |
| 5,728,631 A * | 3/1998 | Wang | 438/787 |
| 5,843,837 A | 12/1998 | Baek et al. | |
| 5,850,105 A | 12/1998 | Dawson et al. | |
| 5,858,876 A | 1/1999 | Chew | |
| 5,872,052 A | 2/1999 | Iyer | |
| 5,913,140 A | 6/1999 | Roche et al. | |
| 5,915,190 A | 6/1999 | Pirkle | |
| 5,920,792 A * | 7/1999 | Lin | 438/633 |
| 5,937,323 A | 8/1999 | Orczyk et al. | |
| 5,939,831 A | 8/1999 | Fong et al. | |
| 5,944,902 A | 8/1999 | Redeker et al. | |
| 5,946,592 A * | 8/1999 | Lin | 438/633 |
| 5,953,635 A | 9/1999 | Andideh | |
| 5,968,610 A | 10/1999 | Liu et al. | |
| 5,969,409 A * | 10/1999 | Lin | 257/637 |
| 5,990,000 A | 11/1999 | Hong et al. | |
| 6,009,827 A | 1/2000 | Robles et al. | |
| 6,030,881 A | 2/2000 | Papasouliotis et al. | |
| 6,037,018 A | 3/2000 | Jang et al. | |
| 6,039,851 A | 3/2000 | Iyer | |
| 6,051,503 A * | 4/2000 | Bhardwaj et al. | 438/705 |
| 6,095,643 A | 8/2000 | Cook et al. | |
| 6,106,678 A * | 8/2000 | Shufflebotham et al. | 204/192.32 |
| 6,136,685 A * | 10/2000 | Narwankar et al. | 438/624 |
| 6,167,834 B1 | 1/2001 | Wang et al. | |
| 6,170,428 B1 | 1/2001 | Redeker et al. | |
| 6,182,602 B1 | 2/2001 | Redeker et al. | |
| 6,189,483 B1 | 2/2001 | Ishikawa et al. | |
| 6,191,026 B1 | 2/2001 | Rana et al. | |
| 6,194,038 B1 * | 2/2001 | Rossman | 427/569 |
| 6,197,705 B1 | 3/2001 | Vassiliev | |
| 6,203,863 B1 | 3/2001 | Liu et al. | |
| 6,204,200 B1 | 3/2001 | Shieh et al. | |
| 6,335,288 B1 | 1/2002 | Kwan et al. | |
| 6,559,026 B1 * | 5/2003 | Rossman et al. | 438/424 |
| 6,821,577 B1 * | 11/2004 | Rossman | 427/569 |
| 2001/0028922 A1 * | 10/2001 | Sandhu | 427/255.27 |
| 2005/0272254 A1 * | 12/2005 | Ding et al. | 438/628 |

FOREIGN PATENT DOCUMENTS

| | | |
|---|---|---|
| EP | 0704893 A2 | 4/1996 |
| EP | 0778358 A1 | 6/1997 |
| EP | 09219401 | 8/1997 |
| EP | 0813240 A1 | 12/1997 |
| EP | 0283311 A2 | 9/1998 |
| JP | 64-79370 | 3/1989 |
| JP | 01079370 A | 3/1989 |
| JP | 2-58836 | 2/1990 |
| JP | 2-148844 | 6/1990 |
| JP | 2-168623 | 6/1990 |
| JP | 402168623 A | 6/1990 |
| JP | 7-161703 | 6/1995 |
| JP | 9-219401 | 8/1997 |
| JP | 1-111877 | 4/1998 |

OTHER PUBLICATIONS

Pending U.S. Appl. No. 09/854,083, filed May 11, 2001, ZhengquanTan et al.

B. Lee et al., *Dielectric Planarization Techniques For narrow Pitch Multilevel Interconnects*, C 1987 IEEE, Jun. 15-16, 1987, (RCA Microelectronics Center, Somerville, NJ 08876, V-MIC Conf., CH 2488-5/87/0000-0085), pp. 85-92.

Tom Abraham, *Reactive Facet Tapering of Plasma Oxide For Multilevel Interconnect Applications*, Jun. 15-16, 1987, (Northern Telecom Electronics Limited,. Ottawa, Ontario, Canada KIY 4H7, V-MIC Conf., CH 2488-5/87/0000-0015), pp. 115-121.

Katsuyuki Masaka, et al., *Single Step Gap Filling Technology for Subhalf Micron Metal Spacings on Plasma Enhanced TEOS/$O_2$ Chemical Vapor Deposition System*, Extended Abstracts of the 1993 International Conference on Solid State Devices and Materals, Makuhari, 1993, pp. 510-512 (Applied Materials Japan Inc. Technology Center, 14-3 Shinizumi Narita, Chiba 286 Japan).

L.Q. Qian, et al., *High Density Plasma Deposition and Deep Submicron Gap Fill With Low Dielectric Constant SIOF Films*, Feb. 21-22, 1995 DUMIC Conference, 1995 ISMIC—101D/92/0050 (440 Kings Village Road, Scotts Valley, CA 95066), no page numbers.

P. Wiegand, et al., *High Density Plasma CVD oxide deposition: the effect of sputtering on the film properties*, Jun. 18-20, 1996 (Hopewell Junction, NY 12533, V-MIC Conf.,), pp. 75-80.

V.Y. Vassiliev, et al., *Trends in void-free pre-metal CVD dielectrics*, Solid State Technology, Mar. 2001, p. 129-136.

* cited by examiner

STAGGERED IN-SITU DEPOSITION AND ETCHING OF A DIELECTRIC LAYER FOR HDP CVD

CROSS REFERENCE TO RELATED APPLICATIONS

This application is a continuation of U.S. patent application Ser. No. 10/234,988, entitled "STAGGERED IN-SITU DEPOSITION AND ETCHING OF A DIELECTRIC LAYER FOR HDP-CVD," filed Sep. 4, 2002 now U.S. Pat. No. 6,821,577 by Kent Rossman, which is a continuation of Ser. No. 09/733,122 now U.S. Pat. No. 6,527,910, entitled "STAGGERED IN-SITU DEPOSITION AND ETCHING OF A DIELECTRIC LAYER FOR HDP-CVD," filed Dec. 8, 2000 by Kent Rossman, which is a divisional of Ser. No. 09/045,278 now U.S. Pat. No. 6,194,038, entitled "METHOD FOR DEPOSITION OF A CONFORMAL LAYER ON A SUBSTRATE," filed Mar. 20, 1998, the entire disclosures of both of which are incorporated herein by reference for all purposes.

BACKGROUND OF THE INVENTION

The present invention relates to the fabrication of integrated circuits. More particularly, the present invention is directed toward a method and apparatus for increasing the deposition rate of a conformal dielectric layer, having excellent gap-filling characteristics, deposited over a stepped surface.

Semiconductor device geometries continue to decrease in size, providing more devices per unit area on a fabricated wafer. Currently, some devices are fabricated with feature dimensions as small as 0.18 µm. For example, spacing between conductive lines or traces on a patterned wafer may be separated by 0.18 µm leaving recesses or gaps of a comparable size. A nonconductive layer of dielectric material, such as silicon dioxide, is typically deposited over the features to fill the aforementioned gap and insulate the features from other features of the integrated circuit in adjacent layers or from adjacent features in the same layer.

One problem encountered, as the feature dimensions of the integrated circuits decrease, is that it becomes difficult to fill the gaps completely between adjacent conductive lines. This problem is referred to as the gap-fill problem and is described below in conjunction with FIGS. 1 and 2. FIG. 1 shows a vertical cross-sectional view of a substrate 10, such as a semiconductor wafer, having a layer of conductive features 12, defining gaps, shown as 14. The sidewalls 16 of the gap are formed by one edge of adjacent conductive features 12. During deposition, dielectric material 18 accumulates on the surfaces 20 of the conductive features 12, as well as the substrate 10 and forms overhangs 22 located at the corners 24 of the conductive features 12. As deposition of the dielectric layer 16 continues, the overhangs 22 typically grow together faster than the gap 14 is filled until a dielectric layer 26 is formed, creating an interior void 28, shown more clearly in FIG. 2. In this fashion, the dielectric layer 26 prevents deposition into the interior void 28. The interior void 28 may be problematic to device fabrication, operation, and reliability.

Many different techniques have been implemented to improve the gap-filling characteristics of dielectric layers, including deposition etch-back (dep-etch) techniques. One such dep-etch technique involves physical sputtering of the dielectric layer by ion bombardment to prevent the formation of voids during a deposition process. The effects of the physical sputtering dep-etch technique is shown in FIG. 3. As shown in FIG. 3, ions 30 incident on the dielectric material transfer energy thereto by collision, allowing atoms 32 to overcome local binding forces and eject therefrom. During the dep-etch technique, dielectric material fills the gap 14 forming a surface 34. The surface 34 lies in a plane that extends obliquely to the sidewalls 16, commonly referred to as a facet. This dep-etch technique may be applied sequentially so that the dielectric layer 26 is deposited and then subsequently etched followed by deposition of additional dielectric material. Alternatively, the deposition process and the etch process may occur concurrently. Whether the deposition and etching are sequential or concurrent, the first order effects on the surface of the dielectric layer 26's profile are the same.

Referring to FIGS. 3 and 4, after an extended dep-etch technique, the portion of the dielectric layer 26 positioned adjacent to the corners 24, regardless of the spacing between the conductive features 12, has a surface 34 that forms an oblique angle with respect to the plane in which the substrate 10 lies. Thereafter, planarization may be accomplished by an extended planarization etch technique where physical sputtering is balanced with the deposition so that very narrow features become completely planarized. Alternatively, a separate planarization process may be employed that is capable of smoothing or eliminating the remaining steps of the large features.

Typically, a plasma-chemical vapor deposition (CVD) process is employed to deposit a dielectric layer using the dep-etch technique. For example, a plasma-enhanced chemical vapor deposition (PECVD) process, or a high-density plasma-chemical vapor deposition process, such as an electron cyclotron resonance chemical vapor deposition (ECR-CVD) process, may be employed. The plasma CVD processes typically allow deposition of high quality films at lower temperature and with faster deposition rates than are typically possible employing purely thermally activated CVD processes. However, the deposition rates available using conventional plasma CVD processes are still relatively low.

What is needed is a method and an apparatus for depositing a conformal dielectric layer over a stepped surface of a substrate at significantly faster rates than was previously possible in the prior art.

SUMMARY OF THE INVENTION

The present invention provides a method and apparatus for greatly increasing the deposition rate of a conformal dielectric layer employing a dep-etch technique. The invention does so by selectively increasing inert gas source concentration, in a process chamber, without a significant increase in chamber pressure.

The dielectric layer is deposited employing a high-density plasma-chemical vapor deposition (HDP-CVD) system, such as an Applied Materials, Inc. Ultima HDP-CVD System. Typically, gaps having a high-aspect ratio of up to 2.5:1 may be present on a substrate upon which the dielectric layer is to be deposited, with the substrate being positioned in a process chamber of the HDP-CVD system. Deposition gases, such as a silicon source gas and an oxygen source gas are flowed across the surface of the substrate along with an inert gas. An RF source generator and an RF bias generator are each in electrical communication with the process chamber to form a plasma from the process and inert gases.

An important consideration during the dep-etch technique is that the deposition-to-etch ratio (dep-etch ratio) be maintained within a predetermined range so as to prevent over-etching and formation of interior voids. The present invention maintains the dep-etch ratio within a suitable range to prevent over-etch, while increasing the deposition rate of the dielectric layer to provide a 100% gap-fill of gaps having an aspect ratio up to 2.5:1. This is accomplished by rapidly increasing the etch rate of the dielectric layer, which allows increasing the deposition rate while maintaining a suitable dep-etch ratio. Specifically, it was discovered that the etch-rate of a dielectric layer is dependent not only upon the pressure of the process chamber, but also upon the concentration of the inert gas therein. The etch rate was found to be inversely proportional to the pressure in the process chamber and proportional to the concentration of inert gas present therein. By selectively terminating the flow of deposition gases in the process chamber, referred to as a staggered in-situ deposition technique, the pressure present therein may be decreased or maintained, while the inert gas concentration is substantially increased. In this fashion, the etch rate of the dielectric layer is substantially increased. The increased etch rate allows increasing the deposition rate using any deposition technique known to those skilled in the art. This decreases the time necessary to deposit the dielectric layer while maintaining a desired dep-etch ratio to provide the dielectric layer with superior gap-filling characteristics.

In a preferred embodiment, the silicon source gas includes silane gas, $SiH_4$ and the oxygen source gas includes molecular oxygen gas, $O_2$. The inert gas source is argon, Ar. The RF source generator operates at a source frequency of about 2 MHz and a source power level between about 12–16 $W/cm^2$. The RF bias generator operates at a frequency of about 13.56 MHz and a power level between about 7–13 $W/cm^2$. The process chamber pressure may be between about 2 and 10 millitorr, with 4–5 millitorr being the preferred pressure range. To deposit the dielectric layer, the silane, oxygen and argon gases are flowed into the process chamber. Specifically, silane is flowed into the process chamber at a flow rate in the range of 40–120 standard cubic centimeters per minute sccm. Oxygen is flowed into the process chamber at a flow rate in the range of 80–250 sccm, and argon is flowed into the process chamber at a flow rate in the range of 40–120 sccm. Selectively, during the deposition process, either the silane flow, the oxygen flow or both are reduced so as to increase the concentration of argon flowing across the substrate. Typically, the flow of both silane and oxygen are terminated for approximately 1.5 seconds, during which time the concentration of argon present in the process chamber is approximately 100%. During a prolonged dep-etch technique, the flow of either silane or oxygen, or both gases are periodically reduced and/or terminated for a predetermined period of time. In this fashion, the etch rate may be substantially increased to 6000 Å per minute, which allows an increase in the deposition rate to 10,000 Å per minute, while maintaining a suitable dep-etch ratio.

For a further understanding of the objects and advantages of the present invention, reference should be made to the ensuing detailed description taken in conjunction with the accompanying drawings.

DETAILED DESCRIPTION OF THE PREFERRED EMBODIMENTS

I. Introduction

In one embodiment, a conformal dielectric layer formed from silicon dioxide is deposited on a stepped substrate employing a standard HDP-CVD system. A high deposition rate is achieved by selectively reducing the flow of deposition gases into a process chamber where a substrate having a stepped surface to be covered by the conformal dielectric layer is disposed. By selectively reducing the flow of deposition gases into the process chamber, the concentration of a sputtering gas, typically comprising argon, in the process chamber is increased without increasing the pressure therein. In this fashion, the etch rate of the conformal dielectric layer, having superior gap-filling characteristics, may be greatly increased to allow an increase in the deposition rate of the same, while maintaining a suitable dep-etch ratio.

II. An Exemplary CVD System

Figure 1:
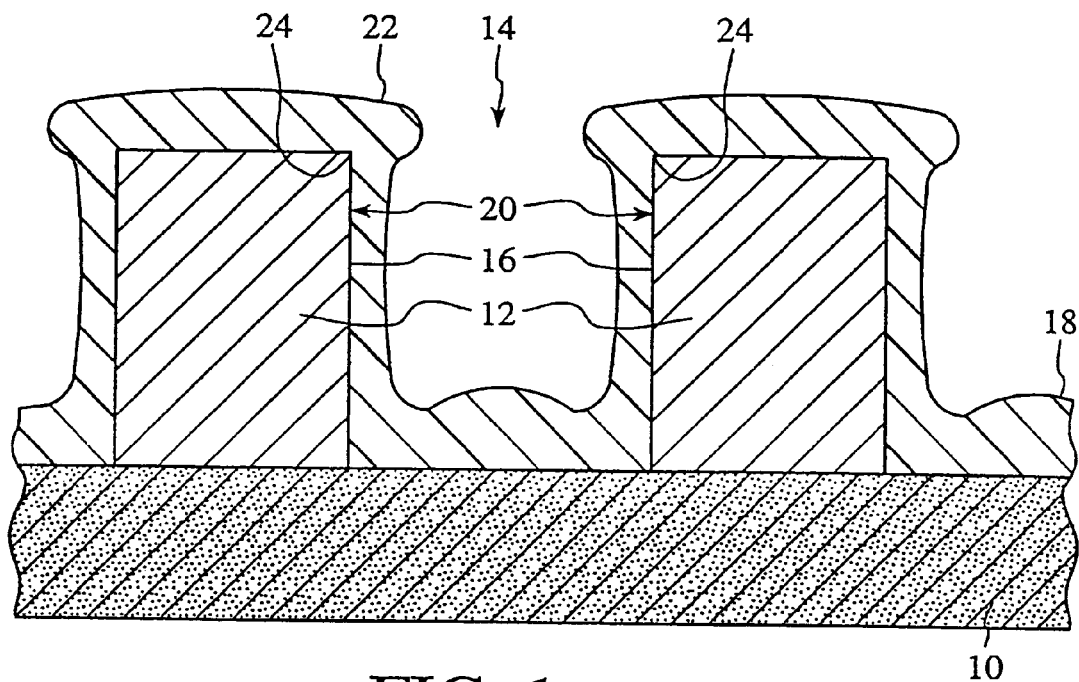
FIG. 1 is a vertical cross-sectional view of substrate, demonstrating accumulation of dielectric material upon conductive features associated therewith, employing prior art deposition methods.
Figure 2:
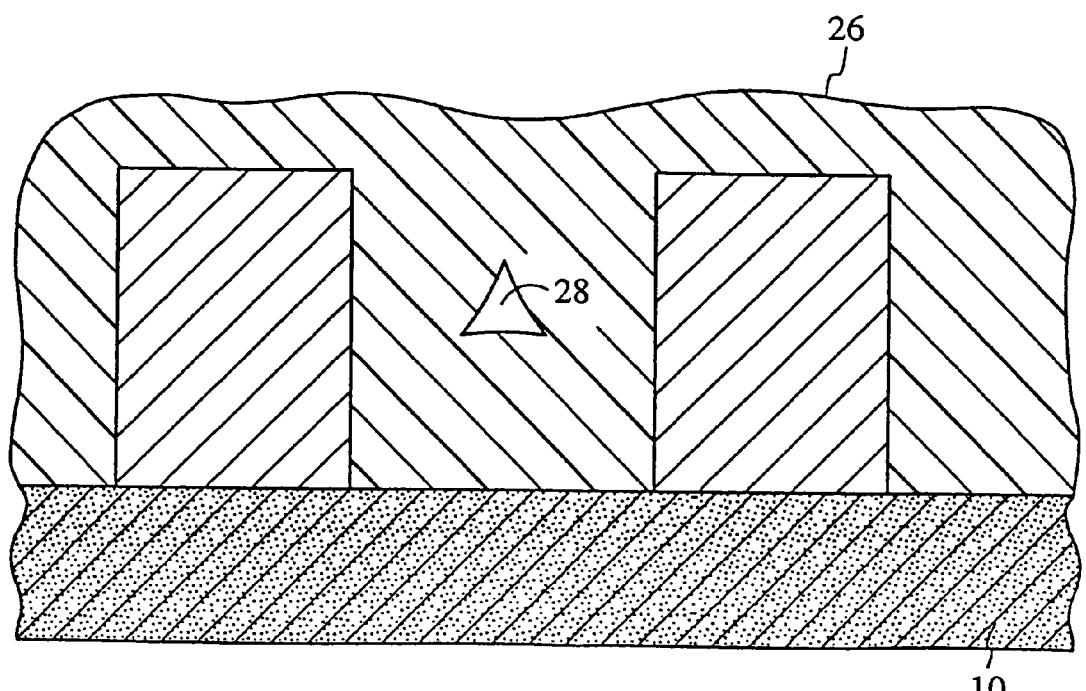
FIG. 2 is a vertical cross-sectional view of the substrate shown in FIG. 1, demonstrating an interior void associated with prior art deposition methods.
Figure 3:
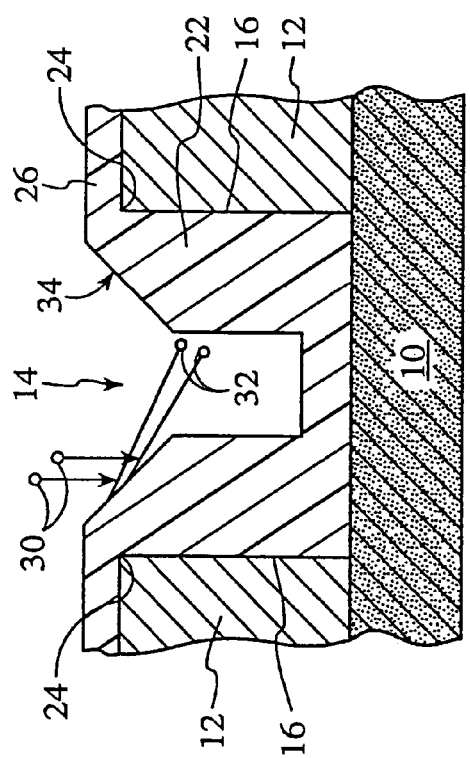
FIG. 3 is a vertical cross-sectional view of the substrate shown in FIGS. 1 and 2 in which a deposition-etch method is employed to remove the interior void shown in FIG. 2 in accordance with a prior art method.
Figure 4:
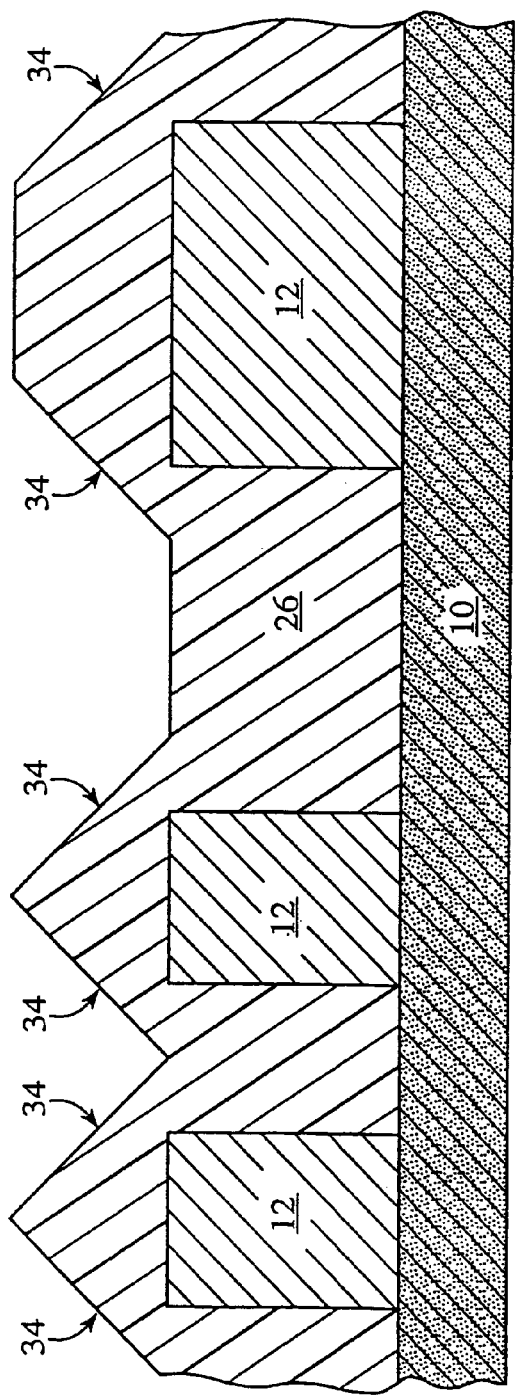
FIG. 4 is a vertical, cross-sectional view of the substrate shown in FIGS. 1, 2 and 3 demonstrating the contour of a dielectric layer disposed employing a prior art deposition etch method.
Figure 5:
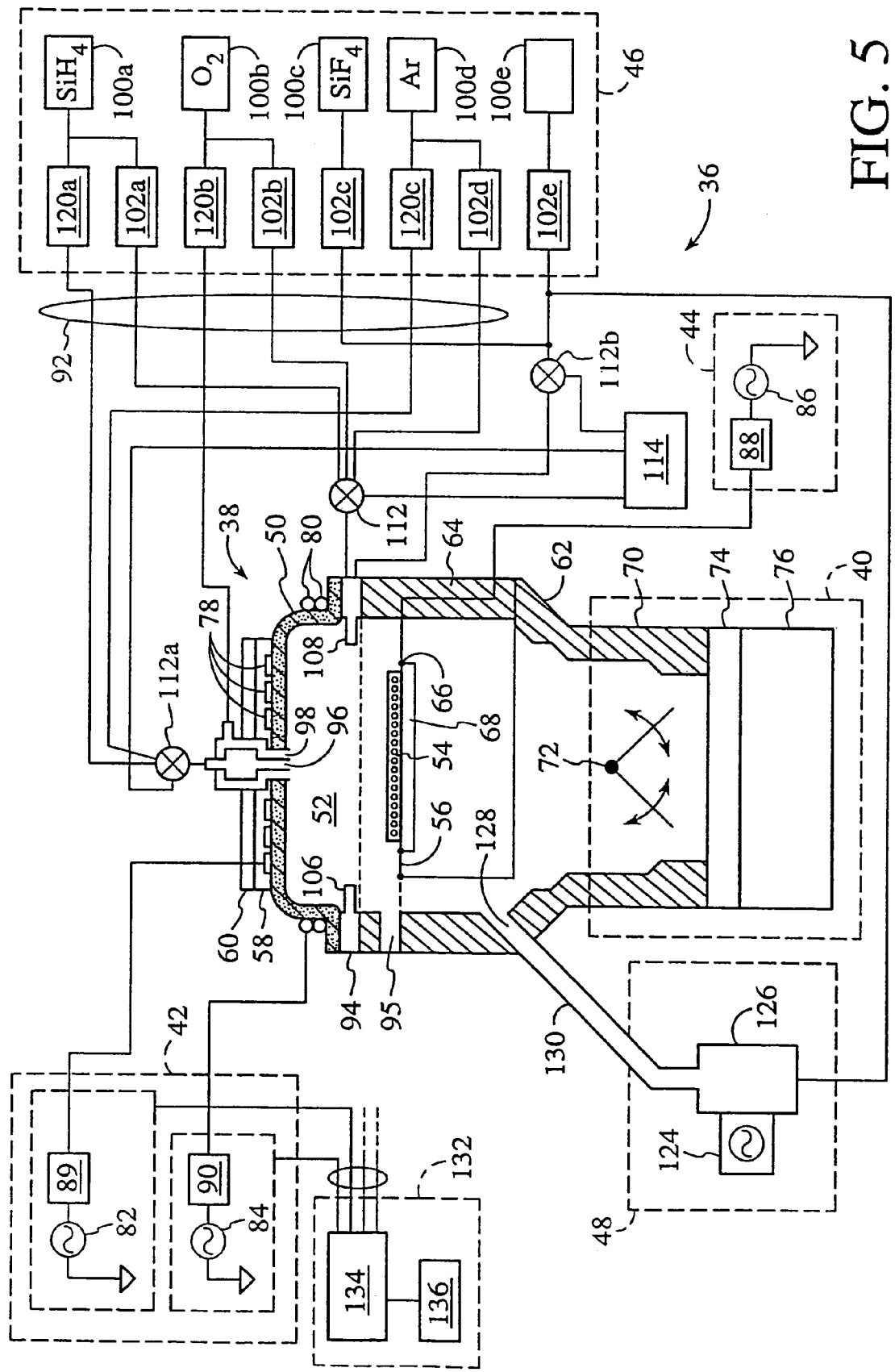
FIG. 5 is a simplified diagram of one embodiment of a HDP-CVD system according to the present invention.

FIG. 5 illustrates one embodiment of a HDP-CVD system 36, in which a dielectric layer according to the present invention can be deposited. The system 36 includes a process chamber 38, a vacuum system 40, a source plasma system 42, a bias plasma system 44, a gas delivery system 46, and a remote plasma cleaning system 48.

An upper portion of process chamber 38 includes a dome 50, which is made of a dielectric material, such as alumina or aluminum nitride. The dome 50 defines an upper boundary of a plasma processing region 52. The plasma processing region 52 is bounded on the bottom by the upper surface of substrate 54 and the substrate support member 56.

A heater plate 58 and a cold plate 60 surmount, and are thermally coupled to, the dome 50. The heater plate 58 and the cold plate 60 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the process chamber and improves adhesion between the deposited layer and the substrate.

The lower portion of process chamber 38 includes a body member 62, which joins the process chamber to the vacuum system. A base portion 64 of the substrate support member 56 is mounted on, and forms a continuous inner surface with, body member 62. Substrates are transferred into and out of process chamber 38 by a robot blade (not shown) through an insertion/removal opening 95 in the side of process chamber 38. A motor (not shown) raises and lowers a lift-pin plate (not shown) that raises and lowers lift pins (not shown) that raise and lower the wafer. Upon transfer into process chamber 38, substrates are loaded onto the raised lift pins, and then lowered to a substrate receiving portion 66 of substrate support member 56. Substrate receiving portion 66 includes an electrostatic chuck 68 that secures the substrate to substrate support member 56 during substrate processing.

The vacuum system 40 includes a throttle body 70, which houses twin-blade throttle valve 72 and is attached to gate valve 74 and turbomolecular pump 76. It should be noted that throttle body 70 offers minimum obstruction to gas flow, and allows symmetric pumping, as described in co-pending, co-assigned United States patent application, originally filed on filed Dec. 12, 1995, and assigned Ser. No. 08/574,839, refiled on Sep. 11, 1996 and assigned Ser. No. 08/712,724 entitled "SYMMETRIC CHAMBER". The gate valve 74 can isolate the pump 76 from the throttle body 70, and can also control process chamber pressure by restricting the exhaust flow capacity when throttle valve 72 is fully open. The arrangement of the throttle valve 72, gate valve 74, and turbo molecular pump 76 allow accurate and stable control of process chamber pressures from about 1 to 100 millitorr.

The source plasma system 42 includes a top coil 78 and side coil 80, mounted on dome 50. A symmetrical ground shield (not shown) reduces electrical coupling between the coils. Top coil 78 is powered by top RF source generator 82, while the side coil 80 is powered by side RF source generator 84, allowing independent power levels and frequencies of operation for each coil. This dual coil system allows control of the radial ion density in process chamber 38, thereby improving plasma uniformity. Side coil 80 and top coil 78 couple energy into the chamber 38 inductively. In a specific embodiment, the top RF source generator 82 provides up to 2500 W of RF power at nominally 2 MHz and the side RF source generator 84 provides up to 5000 W of RF power at nominally 2 MHz. The operating frequencies of the top and side RF generators may be offset from the nominal operating frequency (e.g., to 1.7–1.9 MHz and 1.9–2.1 MHz, respectively) to improve plasma-generation efficiency.

The RF generators 82 and 84 include digitally controlled synthesizers and operate over a frequency range from about 1.7 to about 2.1 MHz. Each generator includes an RF control circuit (not shown) that measures reflected power from the process chamber and coil back to the generator, and adjusts the frequency of operation to obtain the lowest reflected power, as understood by a person of ordinary skill in the art. RF generators are typically designed to operate into a load with a characteristic impedance of 50 Ω. RF power may be reflected from loads that have a different characteristic impedance than the generator. This can reduce power transferred to the load. Additionally, power reflected from the load back to the generator may overload and damage the generator. Because the impedance of a plasma may range from less than 5 Ω to over 900 Ω, depending on the plasma ion density among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 89 and 90 match the output impedance of generators 82 and 84 with coils 78 and 80, respectively. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

The bias plasma system 44 includes a RF bias generator 86 and a bias matching network 88. The bias plasma system 44 capacitively couples substrate receiving portion 66 to the body member 62, which act as complementary electrodes. The bias plasma system 44 serves to enhance the transport of plasma species created by the source plasma system 42 to the surface of the substrate. In a specific embodiment, the RF bias generator 86 provides up to 5000 W of RF power at 13.56 MHz.

Other measures may also help stabilize a plasma. For example, the RF control circuit can be used to determine the power delivered to the load (plasma) and may increase or decrease the generator output power to keep the delivered power substantially constant during deposition of a layer.

The gas delivery system 46 includes a plurality of gas sources 100a, 100b, 100c, 100d and 100e. In one embodiment, the aforementioned gas sources comprise of silane, molecular oxygen, silicon fluoride and argon, respectively. The gas deliverly system 46 provides gases from several sources to the process chamber for processing the substrate via gas delivery lines 92 (only some of which are shown). Gases are introduced into the process chamber 38 through a gas ring 94, a top nozzle 96, and a top vent 98. Specifically, gas sources, 100a and 100d, provide gas to top nozzle 96 via flow controllers 120a and 120c, respectively, and gas delivery lines 92. Gas from gas source 100b is provided to gas vent 98 via flow controller 120b. The top nozzle 96 and top vent 98 allow independent control of top and side flows of the gases, which improves film uniformity and allows fine adjustment of the film's deposition and doping parameters. The top vent 98 is an annular opening around the top nozzle 96 through which gas may flow into the process chamber from the gas delivery system.

Gas is provided from each of the aforementioned gas sources to gas ring 94 via flow controller 102a, 102b, 102c, 102d and 102e and gas delivery lines 92. Gas ring 94 has a plurality of gas nozzles 106 and 108 (only two of which is shown) that provide a uniform flow of gas over the substrate. Nozzle length and nozzle angle may be changed by changing gas ring 94. This allows tailoring the uniformity profile and gas utilization efficiency for a particular process within an individual process chamber. In a specific embodiment, the gas ring 94 has a total of twenty-four gas nozzles, twelve first gas nozzles 108 and twelve second gas nozzles 106. Typically, gas nozzles 108 (only one of which is shown), are coplanar with, and shorter than, the second gas nozzles 106.

In some embodiments, flammable, toxic, or corrosive gases may be used. In these instances, it may be desirable to eliminate gas remaining in the gas delivery lines after a deposition. This may be accomplished using a three-way valve, such as valve 112, to isolate process chamber 38 from delivery line 92a, and to vent delivery line 92a to vacuum foreline 114, for example. As shown in FIG. 5, other similar valves, such as 112a and 112b, may be incorporated on other gas delivery lines. Such three-way valves may be placed as close to process chamber 38 as practical, to minimize the volume of the unvented gas delivery line (between the three-way valve and the process chamber). Additionally, two-way (on-off) valves (not shown) may be placed between a mass flow controller (MFC) and the process chamber or between a gas source and an MFC.

The remote microwave-generated plasma cleaning system 48 is provided to periodically clean deposition residues from process chamber components. The cleaning system includes a remote microwave generator 124 that creates a plasma from a cleaning gas source 100e, such as fluorine, nitrogen trifluoride, or equivalents, in reactor cavity 126. The reactive species resulting from this plasma are conveyed to process chamber 38 through cleaning gas feed port 128 via applicator tube 130. The materials used to contain the cleaning plasma (e.g., cavity 126 and applicator tube 130) should be resistant to attack by the plasma. The distance between reactor cavity 126 and feed port 128 should be kept as short as practical, as the concentration of desirable plasma species may decline with distance from reactor cavity 126. Generating the cleaning plasma in a remote cavity allows the use of an efficient microwave generator and does not subject process chamber components to the temperature, radiation, or bombardment of the glow discharge that may be present in an in situ plasma. Consequently, relatively sensitive components, such as the electrostatic chuck 68, do not need to be covered with a dummy wafer or otherwise protected, as may be required with an in situ plasma cleaning process. During the cleaning process, or other processes, the gate valve 74 may be closed to isolate the turbomolecular vacuum pump 76 from the process chamber. In this configuration, the foreline 114 provides a process vacuum generated by remote vacuum pumps, which are typically mechanical vacuum pumps. Isolating the turbomolecular pump from the process chamber with the gate valve protects the turbomolecular pump from corrosive compounds or other potentially harmful effects resulting from the process chamber clean or other processes.

A system controller 132 regulates the operation of system 36 and includes a processor 134 in electrical communication therewith to regulate the operations thereof. Typically, the processor 134 is part of a single-board computer (SBC), that includes analog and digital input/output boards, interface boards and stepper motor controller boards. Various components of the CVD system 36 conform to the Versa Modular European (VME) standard, which defines board, card cage, as well as connector type and dimensions. The VME standard also defines the bus structure as having a 16-bit data bus and a 24-bit address bus. The processor 134 executes system control software, which is a computer program stored in a memory 136, electronically coupled to the processor 134. Any type of memory device may be employed, such as a hard disk drive, a floppy disk drive, a card rack or a combination thereof. The system control software includes sets of instructions that dictate the timing, mixture of gases, process chamber pressure, process chamber temperature, microwave power levels, pedestal position, and other parameters of a particular process, discussed more fully below with respect to FIG. 7.

Figure 6:
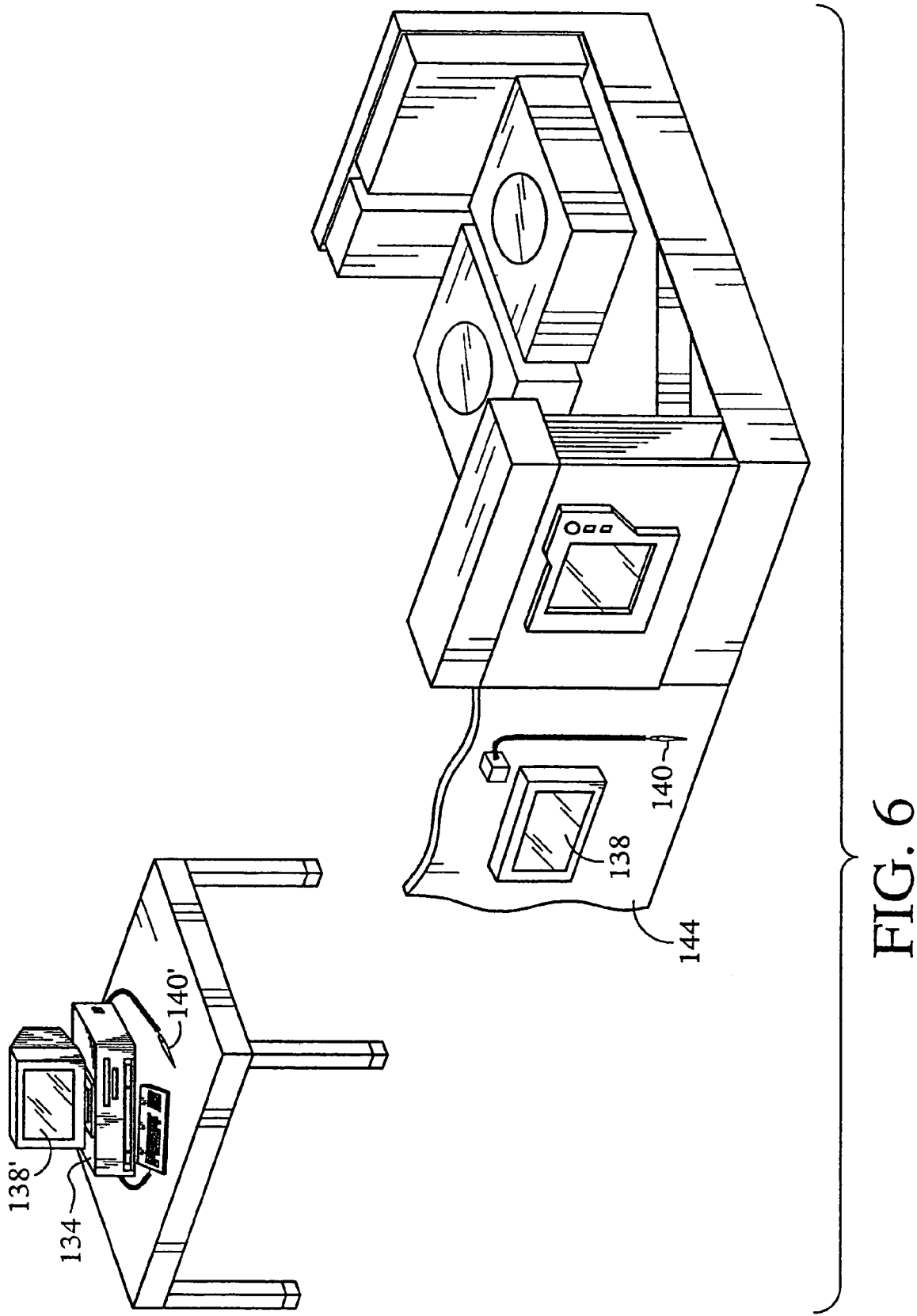
FIG. 6 is a simplified diagram of a monitor and light pen that may be used in conjunction with the exemplary CVD process chamber of FIG. 5.

Referring to FIG. 6, the interface between a user and the processor 134 is via a CRT monitor 138 and light pen 140 In the preferred embodiment two monitors 138 and 138' are used, each having a light pen associated therewith, 140 and 140', respectively. One of the monitors 138 is mounted in a clean room wall 144 for the operators and the other behind the wall for the service technicians. The CRT monitors 138 and 138' may simultaneously display the same information, but only one of the light pens 140 and 140' is enabled for data input during any given time. Were light pen 140 employed to communicate with the processor 134, an operator would place the same on the screen of the CRT monitor 138. A light sensor (not shown) located at the tip of the light pen 140 detects light emitted by the CRT monitor 138. To select a particular screen or function, the operator touches a designated area of the CRT monitor 138 and pushes a button (not shown) on the light pen 140. The touched area provides a visual response, such as a change in color, or a new menu or screen being displayed, confirming communication between the light pen 140 and the CRT monitor 138. Other input devices, such as a keyboard, mouse, or other pointing or communication device, may be used instead of or in addition to the light pen 140 to allow the user to communicate with the processor 134.

The process for depositing the film can be implemented using a computer program product that is executed by the processor 134. The computer program code can be written in any conventional computer readable programming language, for example, 68000 assembly language, C, C++, Pascal, Fortran or others. Suitable program code is entered into a single file, or multiple files, using a conventional text editor, and stored or embodied in a computer usable medium, such as the memory 136, shown in FIG. 5. If the entered code text is in a high level language, the code is compiled, and the resultant compiler code is then linked with an object code of precompiled Windows™ library routines. To execute the linked, compiled object code the system user invokes the object code, causing the processor 134 to load the code in the memory 136. The processor 134 then reads and executes the code to perform the tasks identified in the program.

Figure 7:
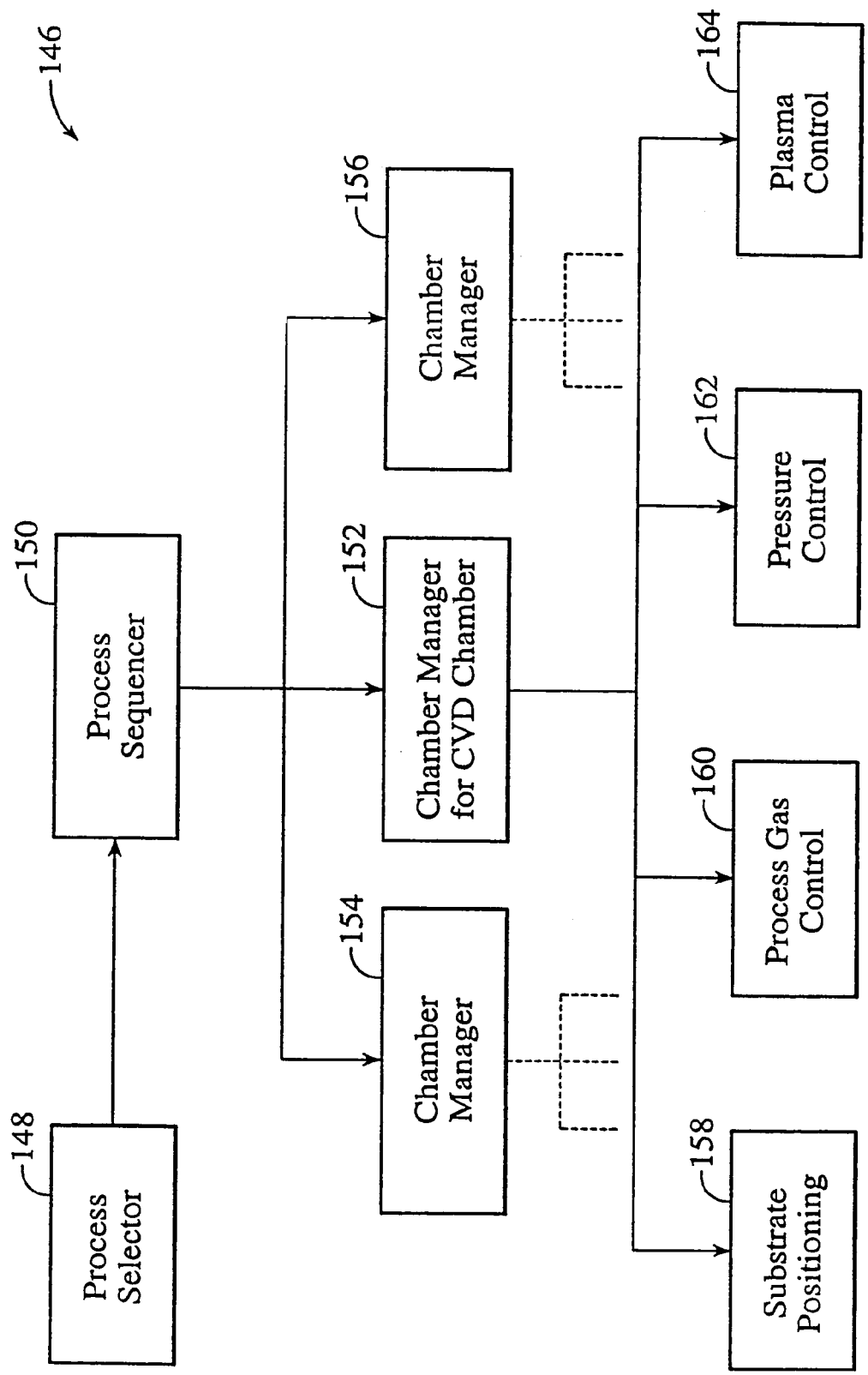
FIG. 7 is a flow chart of an exemplary process control computer program product used to control the exemplary CVD process chamber of FIG. 5.

FIG. 7 shows an illustrative block diagram of the hierarchical control structure of system control software 146. A user enters a process set number and process chamber number into a process selector subroutine 148 in response to menus or screens displayed on the CRT monitor by using the light pen interface. The process sets are predetermined sets of process parameters necessary to carry out specified processes,. and are identified by predefined set numbers. Process selector subroutine 148 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and process chamber dome temperature, and are provided to the user in the form of a recipe. The parameters specified by the recipe are entered utilizing the light pen/CRT monitor interface.

The signals for monitoring the process are provided by the analog input and digital input boards of the system controller and the signals for controlling the process are output on the analog output and digital output boards of the system controller.

A process sequencer subroutine 150 comprises program code for accepting the identified process chamber and set of process parameters from the process selector subroutine 148, and for controlling operation of the various process chambers. Multiple users can enter process set numbers and process chamber numbers, or a user can enter multiple process set numbers and process chamber numbers, so sequencer subroutine 150 operates to schedule the selected processes in the desired sequence. Preferably, sequencer subroutine 150 includes a program code to perform the steps of (i) monitoring the operation of the process chambers to determine if the process chambers are being used, (ii) determining what processes are being carried out in the process chambers being used, and (iii) executing the desired process based on availability of a process chamber and type of process to be carried out. Conventional methods of monitoring the process chambers can be used, such as polling. When scheduling which process is to be executed, sequencer subroutine 150 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 150 determines which process chamber and process set combination is going to be executed next, sequencer subroutine 150 causes execution of the process set by passing the particular process set parameters to process chamber manager subroutines 152, 154 and 156, which control multiple processing tasks in process chamber 38 and possibly other process chambers (not shown) according to the process set determined by sequencer subroutine 150.

Examples of process chamber component subroutines are substrate positioning subroutine 158, process gas control subroutine 160, pressure control subroutine 162, and plasma control subroutine 164. Those having ordinary skill in the art will recognize that other process chamber control subroutines can be included depending on what processes are desired to be performed in process chamber 38. In operation, process chamber manager subroutine 152 selectively schedules or calls the process component subroutines in accordance with the particular process set being executed. Scheduling by process chamber manager subroutine 152 is performed in a manner similar to that used by sequencer subroutine 150 in scheduling which process chamber and process set to execute. Typically, process chamber manager subroutine 152 includes steps of monitoring the various process chamber components, determining which components need to be operated based on the process parameters for the process set to be executed, and causing execution of a process chamber component subroutine responsive to the monitoring and determining steps.

Referring to both FIGS. 5 and 7, in operation the substrate positioning subroutine 158 comprises program code for controlling process chamber components that are used to load the substrate 54 onto substrate support number 68. The substrate positioning subroutine 158 may also control transfer of a substrate into process chamber 38 from, e.g., a PECVD reactor or other reactor in the multichamber system, after other processing has been completed.

The process gas control subroutine 160 has program code for controlling process gas composition and flow rates. Subroutine 160 controls the open/close position of the safety shut-off valves, and also ramps up/down the mass flow controllers to obtain the desired gas flow rates. All process chamber component subroutines, including process gas control subroutine 160, are invoked by process chamber manager subroutine 152. Subroutine 160 receives process parameters from process chamber manager subroutine 152 related to the desired gas flow rates.

Typically, process gas control subroutine 160 operates by opening the gas supply lines, and repeatedly (i) reading the necessary mass flow controllers, (ii) comparing the readings to the desired flow rates received from process chamber manager subroutine 152, and (iii) adjusting the flow rates of the gas supply lines as necessary. Furthermore, process gas control subroutine 160 may include steps for monitoring the gas flow rates for unsafe rates, and activating the safety shut-off valves when an unsafe condition is detected.

In some processes, an inert gas, such as argon, is flowed into process chamber 13 to stabilize the pressure in the process chamber before reactive process gases are introduced into the process chamber. For these processes, the process gas control subroutine 160 is programmed to include steps for flowing the inert gas into process chamber 38 for an amount of time necessary to stabilize the pressure in the process chamber. The above-described steps may then be carried out.

Additionally, when a process gas is to be vaporized from a liquid precursor, for example, tetraethoxysilane (TEOS), the process gas control subroutine 160 may include steps for bubbling a delivery gas such as helium through the liquid precursor in a bubbler assembly or for introducing the helium to a liquid injection valve. For this type of process, the process gas control subroutine 160 regulates the flow of the delivery gas, the pressure in the bubbler, and the bubbler temperature to obtain the desired process gas flow rates. As discussed above, the desired process gas flow rates are transferred to process gas control subroutine 160 as process parameters.

Furthermore, the process gas control subroutine 160 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared with the necessary values and adjusted accordingly.

The process gas control subroutine 160 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 162 includes program code for controlling the pressure in process chamber 38 by regulating the size of the opening of throttle valve 72 in the exhaust portion of the process chamber. There are at least two basic methods of controlling the process chamber with the throttle valve. The first method relies on characterizing the process chamber pressure as it relates to, among other things, the total process gas flow, size of the process chamber, and pumping capacity. The first method sets throttle valve 72 to a fixed position. Setting throttle valve 72 to a fixed position may eventually result in a steady-state pressure.

Alternatively, the process chamber pressure may be measured with a manometer, for example, and throttle valve 72 position may be adjusted according to pressure control subroutine 162, assuming the control point is within the boundaries set by gas flows and exhaust capacity. The former method may result in quicker process chamber pressure changes, as the measurements, comparisons, and calculations associated with the latter method are not invoked. The former method may be desirable when precise control of the process chamber pressure is not required, whereas the latter method may be desirable when an accurate, repeatable, and stable pressure is desired, such as during the deposition of a layer.

When pressure control subroutine 162 is invoked, the desired (or target) pressure level is received as a parameter from process chamber manager subroutine 152. Pressure control subroutine 162 operates to measure the pressure in process chamber 38 by reading one or more conventional pressure manometers connected to the process chamber, compare the measure value(s) with the target pressure, obtain proportional, integral, and differential (PID) values from a stored pressure table corresponding to the target pressure, and adjust throttle valve 72 according to the PID values obtained from the pressure table. Alternatively, pressure control subroutine 162 may open or close throttle valve 72 to a particular opening size to regulate the pressure in process chamber 38 to a desired pressure or pressure range.

The plasma control subroutine 164 comprises program code for controlling the frequency and power output setting of RF generators 82 and 84, and for tuning matching networks 88 and 90. Plasma control subroutine 164, like the previously described process chamber component subroutines, is invoked by process chamber manager subroutine 152.

An example of a system which may incorporate some or all of the subsystems and routines described above would be an Ultima System, manufactured by Applied Materials, configured to practice the present invention.

III. Exemplary Structure

Figure 8:
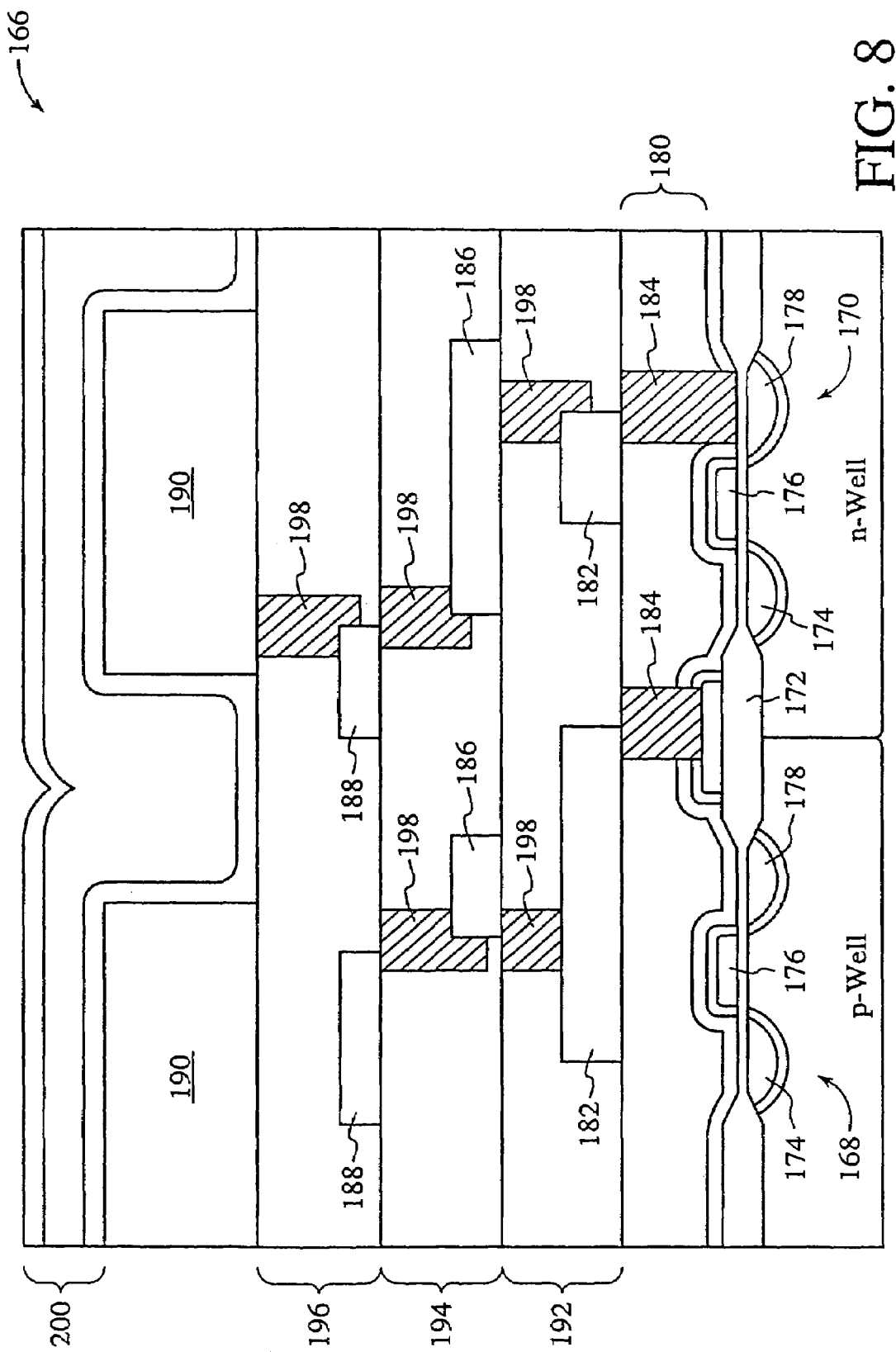
FIG. 8 is a cross-sectional view of an integrated circuit formed employing the present invention.

FIG. 8 illustrates a simplified cross-sectional view of an integrated circuit 166 incorporating features of the present invention. As shown in FIG. 8, integrated circuit 166 includes NMOS and PMOS transistors 168 and 170, which are separated and electrically isolated from each other by a field oxide region 172. Each transistor 168 and 170 comprises a source region 174, a gate region 176, and a drain region 178.

A premetal dielectric layer 180 separates transistors 168 and 170 from a metal layer 182, with connections between metal layer 182 and the transistors made by contacts 184. The metal layer 182 is one of four metal layers, 182, 186, 188 and 190, included in integrated circuit 166. Each metal layer 182, 186, 188 and 190 is separated from adjacent metal layers by respective intermetal dielectric layers 192, 194 and 196, and may be formed by processing steps such as aluminum deposition and patterning. Adjacent metal layers are connected at selected openings by vias 198. Deposited over metal layer 190 are planarized passivation layers 200.

Embodiments of the present invention are particularly useful for intermetal dielectric (IMD) layers, but may find uses in each of the dielectric layers shown in integrated circuit 166. The simplified integrated circuit 166 is for illustrative purposes only. One of ordinary skill in the art could implement the present method for fabrication of other integrated circuits such as microprocessors, application-specific integrated circuits (ASICs), memory devices, and the like. Additionally, the method of the present invention may be used in the fabrication of integrated circuits using other technologies such as BiCMOS, NMOS, bipolar and others.

IV. Staggered In-Situ Deposition

Figure 9:
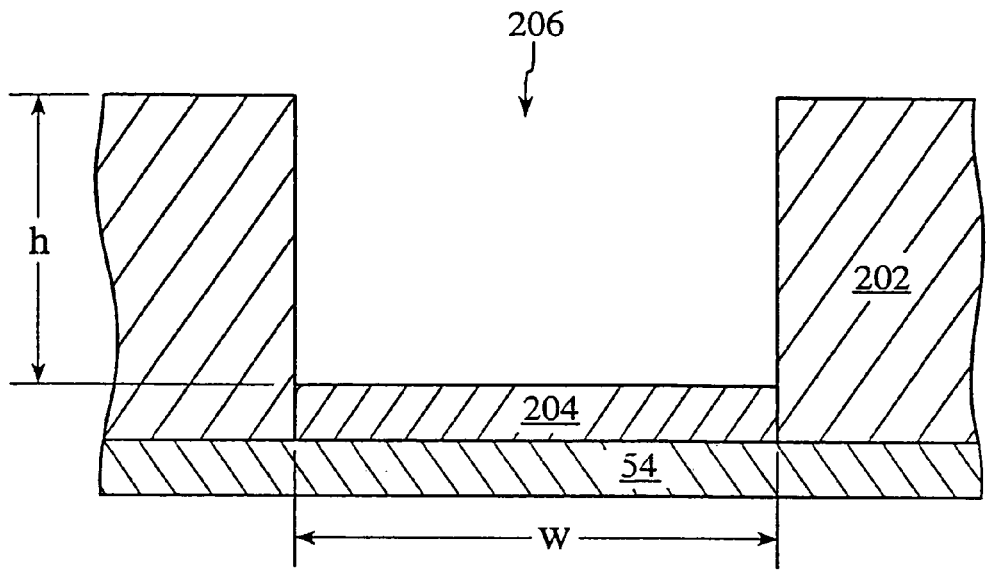
FIG. 9 is a cross-sectional view of a substrate employed in the present invention.

Referring to both FIGS. 5 and 9, the method of the present invention may be employed to deposit dielectric layers on the substrate 56 positioned in the (HDP-CVD) system 36. Although the substrate may have virtually any topography, the substrate 54 typically has stepped surfaces and with have one or more film layers disposed thereon, shown as 202 and 204. The film layer 202 is typically formed from a conductive material that has one or more vias 206 formed therein, before deposition of a dielectric layer employing the present invention. The via 206 may have an aspect ratio of up to 2.5:1 or more, with the aspect ratio being defined as the height of the via 206, H, divided by the via 206's width, W.

Figure 10:
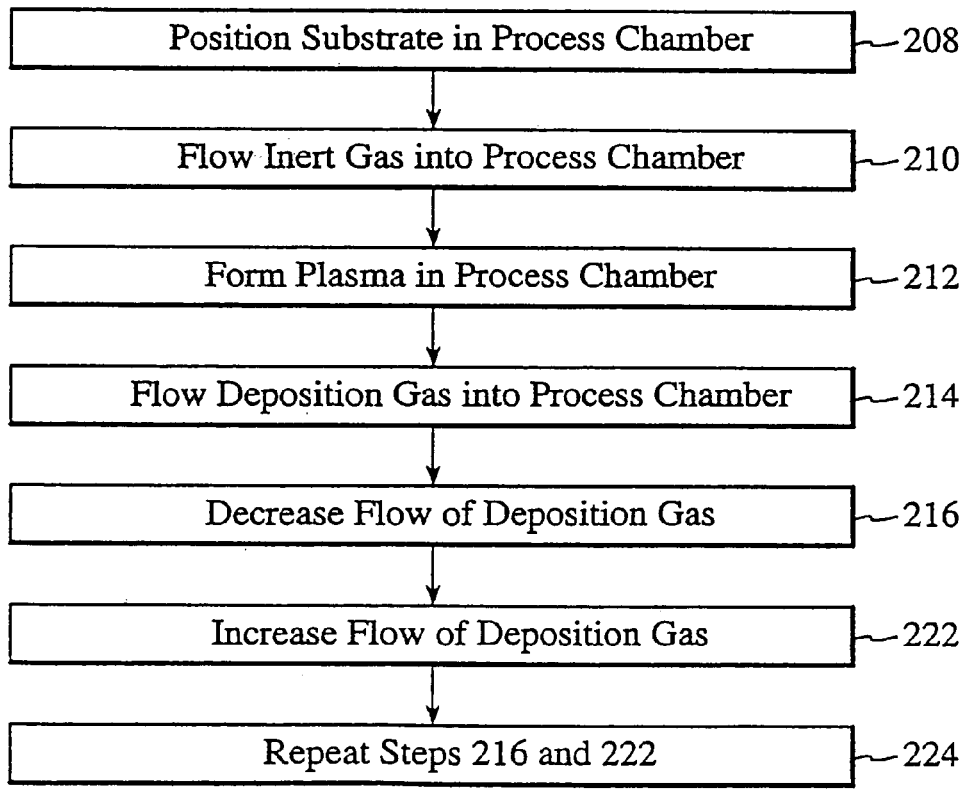
FIG. 10 is a flow diagram of the method in accord with the present invention.

Referring to FIGS. 5, 9 and 10, the method includes a step 208 during which the substrate 54 is positioned in the process chamber 38 proximate to the plasma processing region 52. Subsequent to step 208, an inert gas is flowed into the process chamber 38, during step 210. After the inert gas is introduced into the process chamber 38, a plasma is struck at step 212. Following step 212, a deposition gas is introduced into the process chamber 38, at step 214. The aforementioned inert gas typically comprises a flow of argon gas, Ar. The deposition gas consists of, for example, a silicon source gas, such as silane gas, $SiH_4$, and an oxygen source gas, such as molecular oxygen gas, $O_2$. During the step 210, it is preferred that flow rate of argon is in the range of 40–120 sccm. The flow rate of the silane gas is in the range of 40–120 sccm, and the oxygen gas is flowed into the process chamber at a flow rate in the range of 80–250 sccm. The aforementioned plasma is formed by the RF source generators 82 and 84 creating an RF field in the plasma processing region 52 having a frequency of about 2 MHz and a power level between about 12–16 $W/cm^2$, and the RF bias generator 86 creating an RF field having a frequency of about 13.56 MHz and a power level between about 7–13 $W/cm^2$. Typically, the pressure in the process chamber is maintained between about 2 and 10 millitorr, with 4–5 millitorr being the preferred pressure range. During step 214, the dielectric layer 215, is deposited over layers 202 and 204 to fill the gap 206 (shown in FIG. 10) and is concurrently, which is understood to be primarily attributed to the ions generated from the argon gas. The source components of the plasma dissociates the atoms and molecules of the process chamber gases into a plasma, and the bias component of the plasma moves the plasma species to and from the surface of the dielectric layer being deposited. The bias component conveys deposition ions to the dielectric layer surface for combination therein and sputtering thereof.

An important consideration when depositing the dielectric layer 214 using a dep-etch technique is maintaining a suitable dep-etch ratio to prevent over etching of the dielec tric layer 215 and formation of interior voids. For purposes of this application, the dep etch-ratio is defined as follows:

$$D/E = D_S/[D_S - D_{(S+B)}]$$

where D/E is the dep-etch ratio, $D_S$ is the deposition rate with only the RF source applied, and $D_{(S+B)}$ is the deposition rate with both the RF source and the RF bias applied. The range advocated for the dep-etch ratio is typically dependent upon the largest aspect ratio present on the substrate surface. It has been found that with a 2.5:1 aspect ratio, the dep-etch ratio should be kept within the range of 2.8:1 to 3.2:1. In accordance with this finding, a dep-etch ratio less than 2.8:1 may result in over-etching of the step surface, and a dep-etch ratio in excess of 3.2:1 may result in the formation of interior voids.

The dep-etch ratio may be varied in a number of ways. For example, the dep-etch ratio may be increased by either increasing the deposition rate at a substantially constant etch rate, or decreasing the etch rate at a substantially constant deposition rate both results in an increased dep-etch ratio. Conversely, the dep-etch ratio may be decreased by decreasing the deposition rate at a substantially constant etch rate, or by increasing the etch rate at a substantially constant deposition rate. Varying the RF bias energy also affects the dep-etch ratio. Specifically, it is believed that by decreasing the RF bias energy, the etch-rate is decreased and the deposition rate is increased, thereby increasing the dep-etch ratio. By increasing the RF bias energy, the dep-etch ratio may be decreased in an analogous manner. However, it is not preferred to vary the RF bias energy, because the same is optimized to obtain plasma uniformity. Varying the RF bias energy could degrade plasma uniformity, which could degrade the quality of a deposited dielectric layer.

Figure 11:
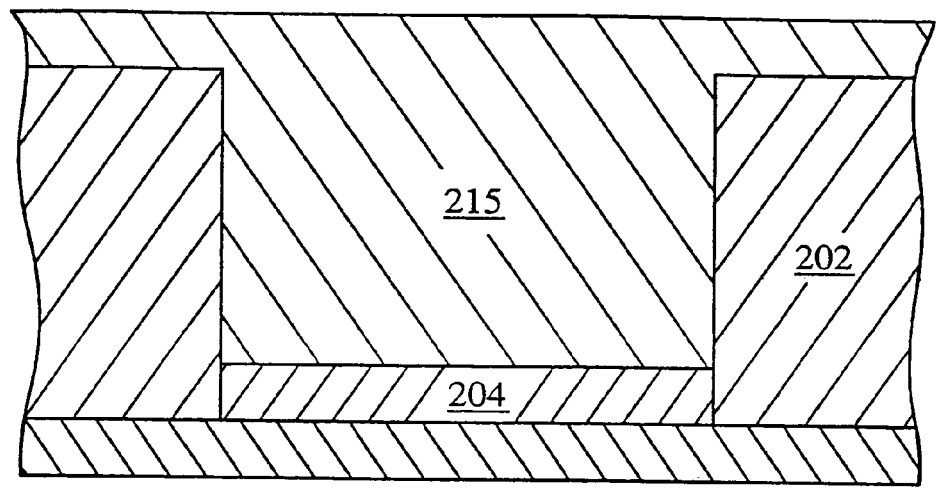
FIG. 11 is a cross-sectional view of the substrate shown in FIG. 10 with a gap-filling dielectric layer disposed thereon.
Figure 12:
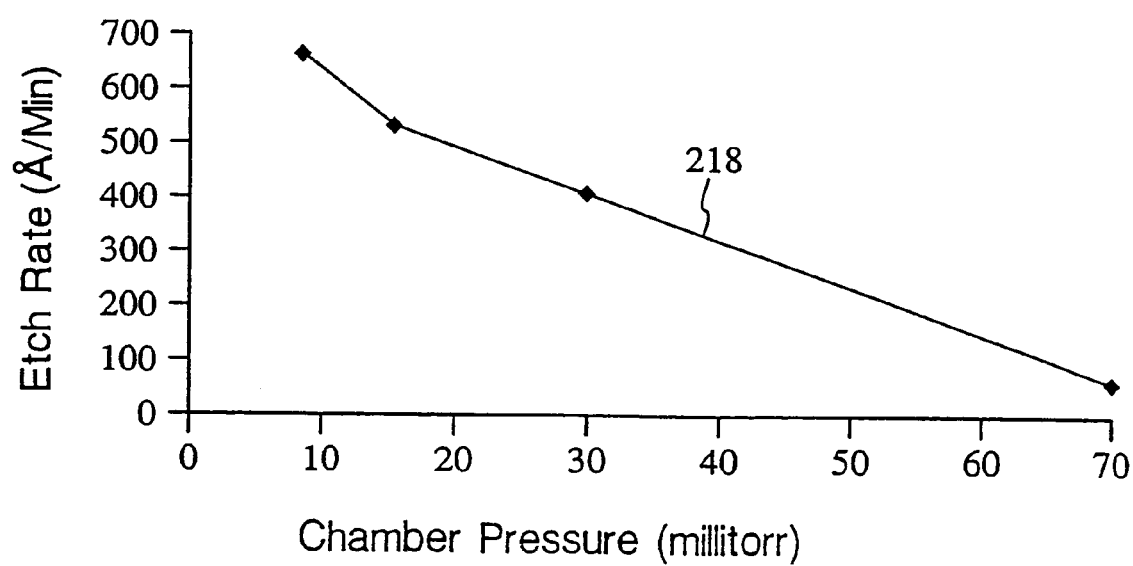
FIG. 12 is a graph showing the relationship between chamber pressure and etch rate of the dielectric layer shown in FIG. 11.
Figure 13:
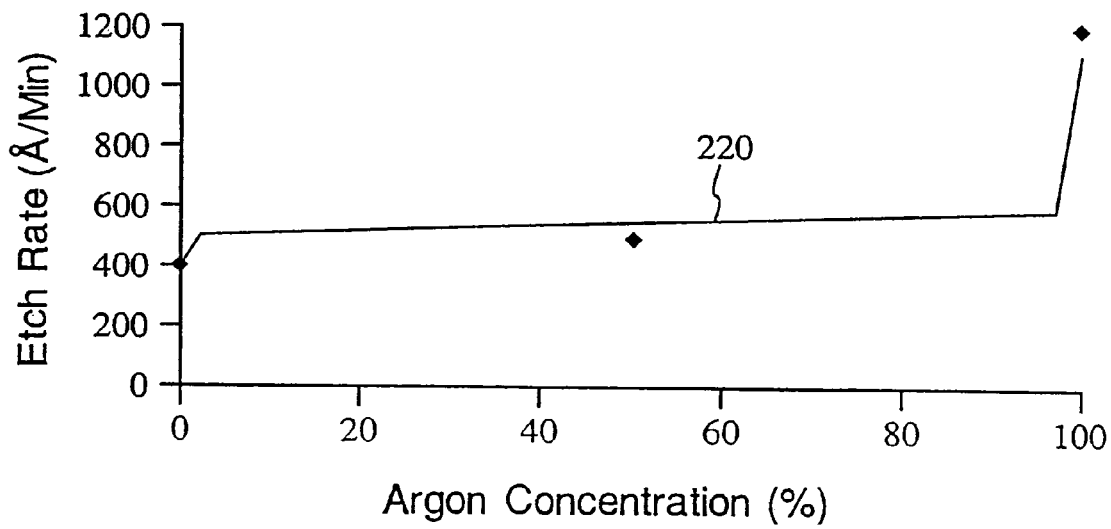
FIG. 13 is a graph showing the relationship between argon concentration, in a process chamber of the HDP-CVD system shown in FIG. 5 and etch rate of the dielectric layer shown in FIG. 12.

Referring to both FIGS. 10 and 11, the present method allows a substantial increase in both the deposition rate and the etch rate while maintaining a suitable dep-etch ratio and without affecting plasma uniformity, i.e., without changing the RF bias energy. The method does so by selectively reducing the flow into the process chamber 38, of either the silane source or the oxygen source, or both, at step 216. In this fashion, the present method takes advantage of a discovery that the etch rate of the dielectric layer 215 is dependent not only upon the pressure of the process chamber, but also upon the concentration of the inert gas therein. Specifically, it was found that, for a given RF bias power, the etch rate is inversely proportional to the pressure in the process chamber and proportional to the concentration of inert gas present therein. For example, the curve 218, shown in FIG. 12, shows that at a chamber pressure of 60 millitorr, the etch rate of a dielectric layer is less than 200 Å per minute. A chamber pressure of 10 millitorr, on the other hand, provides an etch rate for a dielectric layer in excess of 600 Å per minute, a three-fold increase. As shown by the curve 220 in FIG. 13, the argon concentration in the process chamber 38 also effects the etch rate. As shown, by the curve 220, at an argon concentration level in the range of 20% to 80% there is a negligible change in the etch rate of the dielectric layer. However, at argon gas concentration levels reaching 100%, the etch rate of the dielectric layer is greatly increased, reaching nearly 1,200 Å per minute. This allows increasing the deposition rate using any suitable means known to those skilled in the art, e.g., increasing the flow rate of the deposition gases, while maintaining a suitable dep-etch ratio. If preferred, the deposition rate may be greatly increased, employing the present invention, while maintaining a constant dep-etch ratio.

Referring to FIGS. 5, 10 and 11 to take advantage of the aforementioned concepts, it was discovered that the etch rate of the dielectric layer may be greatly increased by selectively decreasing the flow of deposition gases into the process chamber 38. In this fashion, the pressure present therein may be decreased or maintained, while the inert gas concentration is substantially increased. Increasing the etch rate, as discussed above, allows increasing the flow rate of the deposition gases into the process chamber 38, thereby increasing the deposition rate while maintaining a desired dep-etch ratio. This decreases the time necessary to deposit the dielectric film, while maintaining superior gap fling characteristics of the dielectric film. To that end, after the plasma is struck at 212, the silicon source and oxygen source gases are flowed into the process chamber 38 for a predetermined amount of time, as step 214, which is dependent upon both the plasma species present and the desired thickness of the resulting dielectric layer. For example, with the aforementioned plasma, a dielectric layer having a thickness approximating 10,000 Å may be formed within 90 to 120 seconds.

In a preferred embodiment, step 216 occurs approximately 60–70 seconds after step 214. During step 216 the flow of both the silicon source gas and the oxygen source gas are simultaneously terminated for approximately 10–15 seconds, allowing the concentration of argon present in the process chamber 38 to approach 100%. Thereafter, shown as step 222, the silicon source gas and the oxygen source gas are again flowed into the process chamber 38 at the rate described above with respect to step 210. The flow rate of the silicon and oxygen source gases may be periodically reduced, during a prolonged dep-etch technique, by repeating steps 216 and 222, shown as step 224. In this fashion, the etch rate of the dielectric layer 215 may be substantially increased, while maintaining a suitable deposition-to-etch ratio (dep-etch ratio). With the method described above, the etch rate at step 216 may be up to 6,000 Å per minute or more. This allows an increase in the deposition rate, at steps 214 and 222, in excess of 10,000 Å per minute.

Figure 14:
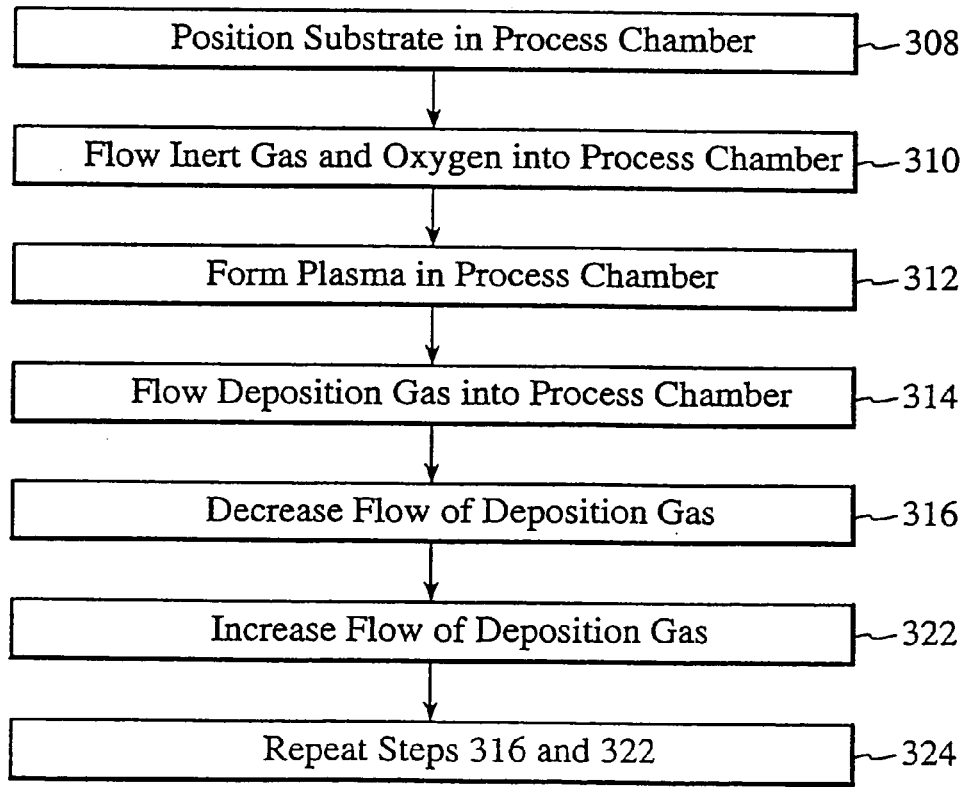
FIG. 14 a flow diagram of an alternate embodiment of the method shown above in FIG. 10.

As mentioned above, an increased etch rate of the dielectric layer 215 may be obtained by merely decreasing the flow of one of the silane gas or oxygen gas. As a result, the method, shown in FIG. 14 may be employed for depositing a dielectric layer. Step 308 is identical to step 208, described above in FIG. 10. Step 310 of FIG. 14, however, includes flowing both an inert gas and an oxygen source gas into the process chamber 38, shown in FIG. 5. At step 312, a plasma is formed therein, as discussed above, with respect to step 212 and shown in FIG. 11. Thereafter, at step 314 shown in FIG. 14, the silane source gas is flowed into the process chamber 38, shown in FIG. 5. At step 316, the flow of silane is decreased so as to achieve a desired etch rate of the dielectric layer being deposited. At step 322, the flow of the silane gas source is restarted to the flow rate of the silane gas source at step 314. The flow rate of the silicon source gas may be periodically reduced, during a prolonged dep-etch technique, by repeating steps 316 and 322, shown as step 324 to obtain a dielectric layer of desired thickness. The method may be varied to control both the deposition and etch rates as desired. The scope of the invention should, therefore, be determined not with reference to the above description, but instead should be determined with reference to the appended claims along with their full scope of equivalents.

What is claimed is:

1. A method for depositing a dielectric layer over a substrate disposed in a substrate processing chamber, the substrate having a gap formed between adjacent raised surfaces, the method comprising:
  flowing a deposition gas into the process chamber;
  flowing an inert gas into the process chamber;
  forming a high-density plasma from the deposition gas and the inert gas to deposit a first portion of the dielectric layer over the substrate and within the gap using a process that has simultaneous deposition and sputtering components to provide a deposition-to etch ratio of the process defined by a set of process parameters;
  thereafter, changing the set of process parameters to decrease the deposition-to-etch ratio of the process; and
  thereafter changing the set of process parameters to increase the deposition-to-etch ratio of the process and deposit a second portion of the dielectric layer over the substrate.

2. The method recited in claim 1 wherein flowing the deposition gas into the process chamber comprises:
  flowing gas into the process chamber at a plurality of first positions disposed outside a periphery of the substrate; and
  flowing additional gas into the process chamber from a position spaced apart from and located above the surface of the substrate.

3. The method recited in claim 2 wherein:
  the deposition gas comprises a silicon source gas and an oxygen source gas; and
  flowing the deposition gas into the process chamber comprises:
    flowing the silicon source gas into the process chamber at a first portion of the first positions; and
    flowing the oxygen source gas into the process chamber at a second portion of the first positions, the second portion being different from the first portion.

4. The method recited in claim 3 wherein:
  the silicon source gas comprises a silane; and
  the oxygen source gas comprises oxygen.

5. The method recited in claim 2 further comprising directing the inert gas towards a surface of the substrate.

6. The method recited in claim 1 wherein the inert gas comprises Ar.

7. The method recited in claim 1 wherein the gap has as aspect ratio of 2.5:1 or greater.

8. The method recited in claim 1 wherein changing the set of process parameters to decrease the deposition-to-etch ratio of the process comprises terminating a flow of the deposition gas.

9. The method recited in claim 8 wherein changing the set of process parameters to increase the deposition-to-etch ratio of the process comprises restarting the flow of the deposition gas.

10. The method recited in claim 1 wherein forming the high-density plasma comprises forming the high-density plasma with a first coil disposed on top of the process chamber and a second coil surrounding a sidewall of the process chamber.

11. The method recited in claim 1 further comprising maintaining a pressure within the process chamber between 2 and 10 millitorr.

12. The method recited in claim 1 wherein forming the high-density plasma comprises creating an rf field having a power level between about 7 and 13 $W/cm^2$.

* * * * *